US012198776B2

(12) United States Patent
Schaefer et al.

(10) Patent No.: US 12,198,776 B2
(45) Date of Patent: Jan. 14, 2025

(54) METADATA STORAGE AT A MEMORY DEVICE

(71) Applicant: Micron Technology, Inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 17/648,393

(22) Filed: Jan. 19, 2022

(65) Prior Publication Data

US 2022/0238174 A1    Jul. 28, 2022

Related U.S. Application Data

(60) Provisional application No. 63/142,413, filed on Jan. 27, 2021.

(51) Int. Cl.
*G11C 29/42* (2006.01)
*G11C 29/12* (2006.01)
*G11C 29/44* (2006.01)
*H03K 19/173* (2006.01)

(52) U.S. Cl.
CPC ......... *G11C 29/42* (2013.01); *G11C 29/1201* (2013.01); *G11C 29/4401* (2013.01); *H03K 19/1737* (2013.01)

(58) Field of Classification Search
None
See application file for complete search history.

(56) References Cited

U.S. PATENT DOCUMENTS

| 2014/0053033 | A1  | 2/2014  | Roohparvar et al. |
| 2016/0321015 | A1  | 11/2016 | Fukutomi et al. |
| 2017/0206030 | A1  | 7/2017  | Woo et al. |
| 2020/0210280 | A1* | 7/2020  | Singidi ............... G06F 11/108 |
| 2021/0248119 | A1* | 8/2021  | Li ..................... G06F 3/0685 |
| 2021/0358559 | A1* | 11/2021 | Suh .................... G11C 29/18 |

FOREIGN PATENT DOCUMENTS

| KR | 10-2015-0042220 A | 4/2015 |
| KR | 10-2017-0052576 A | 5/2017 |

OTHER PUBLICATIONS

"International Search Report and Written Opinion of the International Searching Authority," issued in connection with Int'l Appl. No. PCT/US2022/070322 dated Apr. 29, 2022 (9 pages).

* cited by examiner

*Primary Examiner* — Guerrier Merant
(74) *Attorney, Agent, or Firm* — Holland & Hart LLP

(57) ABSTRACT

Methods, systems, and devices for metadata storage at a memory device are described to support storage of metadata information and error control information at a memory device. The metadata information and error control information may be received at the memory device via a sideband channel and corresponding pin. For example, a set of bits received via the pin may include a subset of error control bits and a subset of metadata bits. Circuitry at the memory device may receive the set of bits via the pin and may identify metadata information and error control information within the set of bits. The circuitry may route the metadata information to a corresponding subset of memory cells and the error control information to an error control circuit, where the error control circuit may route the error control information to a corresponding subset of memory cells.

35 Claims, 5 Drawing Sheets

METADATA STORAGE AT A MEMORY DEVICE

CROSS REFERENCE

The present Application for Patent claims priority to U.S. Provisional Patent Application No. 63/142,413 by SCHAEFER et al., entitled "METADATA STORAGE AT A MEMORY DEVICE," filed Jan. 27, 2021, which is assigned to the assignee hereof and is expressly incorporated by reference in its entirety herein.

FIELD OF TECHNOLOGY

The following relates generally to one or more systems for memory and more specifically to metadata storage at a memory device.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
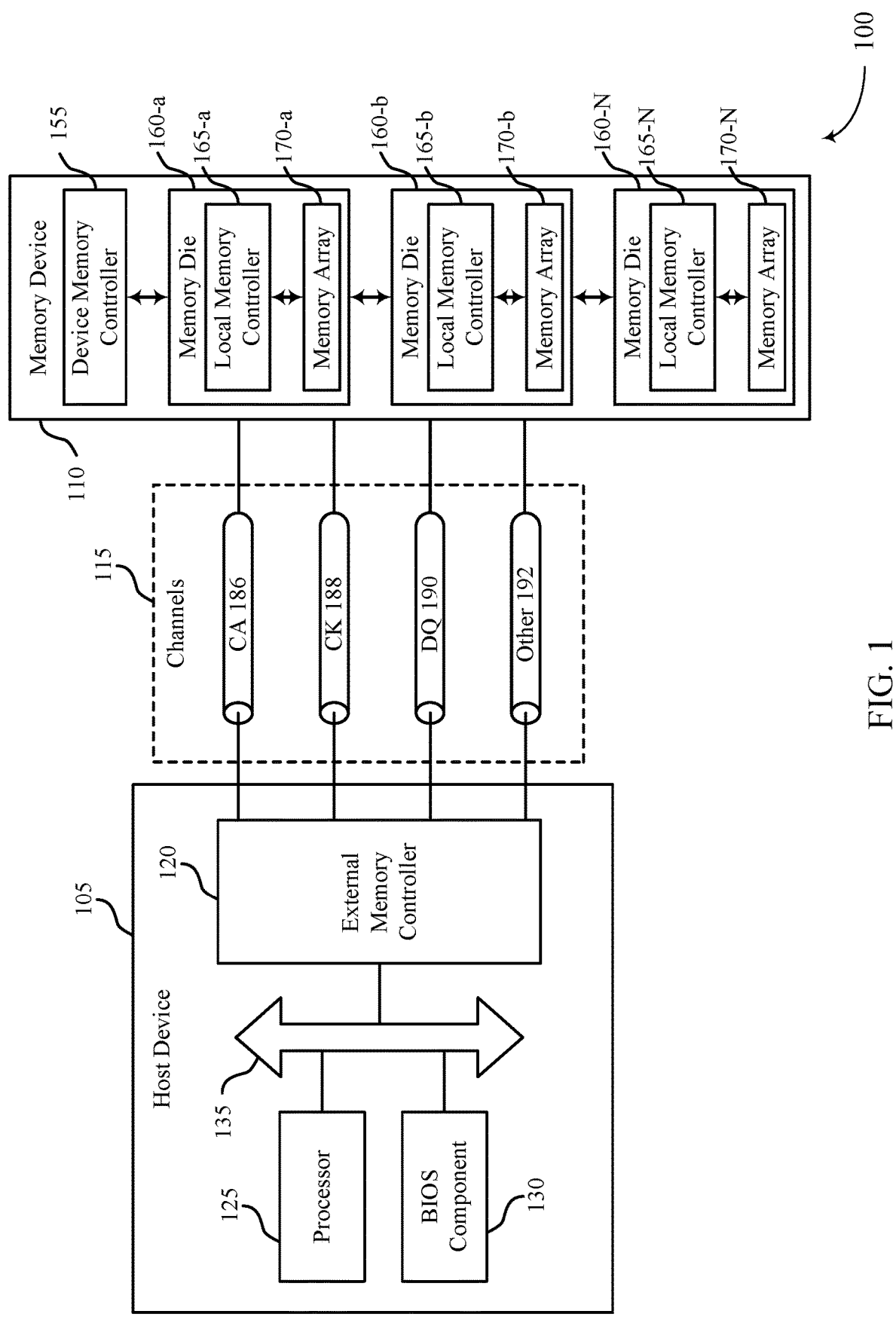
FIG. 1 illustrates an example of a system that supports metadata storage at a memory device in accordance with examples as disclosed herein.

A host device may communicate error control information (e.g., error correction code (ECC), error detection code (EDC), or higher levels of error correction, where the ECC code may include single error detection double error detection (SECDED)) to a memory device. In some cases, the error control information may be communicated in-line with associated data (e.g., communicated over a same channel and stored in a same set of memory cells), which may increase a time duration of access operations (e.g., read or write operations) at the memory device. In some cases, it may also reduce available memory storage at a main memory array of the memory device (e.g., when the error control information is stored in the main array). In some cases, error control information or metadata information that include error control information may be communicated from the host device to the memory device via a sideband channel. In some cases, the information communicated via the sideband channel may be stored at a subset of memory cells of the memory device (e.g., a subset associated with metadata information or error control information). This error control information may, in some cases, result in a lower diagnostic coverage than the in-line error control information, for example, based on address encoding bits included in the error control information, where the error control information may be limited (e.g., to a quantity of bits) when stored at the subset of memory cells corresponding to metadata information or error control information. In some cases, the systems, devices, and techniques described herein may provide an extension for an existing system for sideband channel error control communication to enable use of error control components for other purposes or extend error control capabilities.

The present disclosure provides techniques for both providing storage for metadata information and for error control information at the memory device (e.g., each at a corresponding subset of memory cells). The metadata information and the error control information may be received at the memory device via a same sideband channel (e.g., in a serial fashion). For example, a set of bits received via the pin may include a subset of error control bits and a subset of metadata bits. The memory device may include circuitry for processing the set of bits. The circuitry may represent logic circuitry that may receive the set of bits via the pin and may identify metadata information and error control information within the set of bits. The circuitry may route the metadata information to a corresponding subset of memory cells (e.g., via a respective bus). The circuitry may also route the error control information to an error control circuit (e.g., one or more components of error control circuitry, such as a multiplexer), where the error control circuit may route the error control information to a corresponding subset of memory cells (e.g., based on a configuration as described herein).

The described techniques may support increasing an amount of information (e.g., error control information) stored at the memory device for each set of data stored at the memory device when communicated via a sideband channel (e.g., extend capabilities of an error control system). The increased amount of storage for error control information at the memory device may increase a diagnostic coverage provided by the memory device and may additionally or alternatively provide for storing other information at the memory device (e.g., additional metadata information).

Features of the disclosure are initially described in the context of systems and dies as described with reference to FIG. 1. Features of the disclosure are described in the context of a device architecture and a process flow as described with reference to FIGS. 2 and 3. These and other features of the disclosure are further illustrated by and described with reference to an apparatus diagram and a flowchart that relate to metadata storage at a memory device as described with reference to FIGS. 4 and 5.

FIG. 1 illustrates an example of a system 100 that supports metadata storage at a memory device in accordance with examples as disclosed herein. The system 100 may include a host device 105, a memory device 110, and a plurality of channels 115 coupling the host device 105 with the memory device 110. In some cases, the system 100 may be referred to as a memory device 110 or memory devices 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

A memory device 110 may store metadata information and error control information communicated over a sideband channel (e.g., each at a corresponding subset of memory cells of the memory device). The metadata information and the error control information may be received at the memory device 110 via a same sideband channel (e.g., a dedicated channel 115) and corresponding pin, in a serial fashion. For example, a set of bits received via the pin may include a subset of error control bits and a subset of metadata bits. The memory device 110 may include circuitry for processing the set of bits. The circuitry may represent logic circuitry that may receive the set of bits via the pin and may identify metadata information and error control information within the set of bits. The circuitry may route the metadata information to a corresponding subset of memory cells (e.g., of a memory array 170). In parallel, the circuitry may route the error control information to an error control circuit (e.g., a multiplexer), where the error control circuit may route the error control information to a corresponding subset of memory cells (e.g., of the memory array 170).

Figure 2:
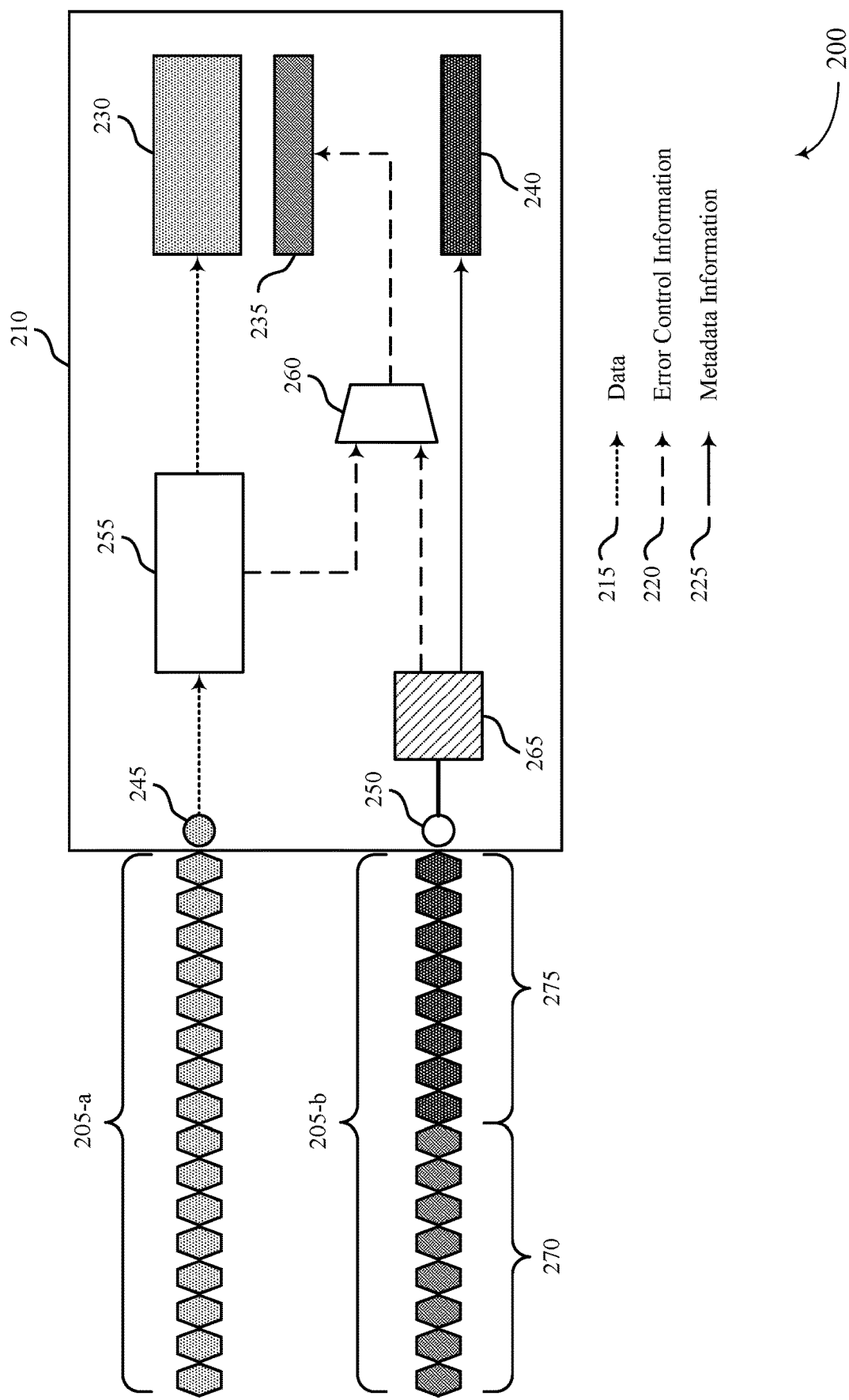
FIG. 2 illustrates an example of a device architecture that supports metadata storage at a memory device in accordance with examples as disclosed herein.

FIG. 2 illustrates an example of a device architecture 200 that supports metadata storage at a memory device in accordance with examples as disclosed herein. In some examples, device architecture 200 may represent or implement aspects of system 100. For example, device architecture 200 may represent an architecture of a memory device 210, which may represent an example of a memory device 110 described with reference to FIG. 1. The memory device 210 may be operable to receive one or more sets of bits 205 from a host device (e.g., or other source external to the memory device 210), where a set of bits 205 may include data 215, error control information 220 (e.g., parity bits such as ECC, EDC, or both), metadata information 225, or any combination thereof. The memory device 210 may receive a set of bits 205 via a pin, where the set of bits 205 may be received as a series of pulses as described herein. For example, data bits may be received via a DQ pin 245, which may represent a dedicated pin for reception of data 215 (e.g., via a data channel).

Each set of bits 205 received at the memory device 210 may be communicated via a respective channel (e.g., from the host device). In some cases (e.g., in order to meet automotive hardware functional safety metrics), the host device may communicate the error control information 220 to the memory device 210. For example, the error control information may be configured to perform link ECC associated with communicating information between the host device and the memory device. In some examples, the error control information may be configured to perform on-die ECC with stored data in the memory array (e.g., only with stored data in the memory array). The error control information may be configured to perform error correction or error detection on data communicated from the host device to the memory device 210, data stored at the memory device 210, and/or data communicated from the memory device 210 back to the host (e.g., end-to end protection on a memory channel). The error control information 220 may be associated with a corresponding set of bits 205 communicated over the channel and may be communicated "in-line" with data 215 (e.g., may be communicated in series with the data 215 and stored in a same set of memory cells as the data 215).

Error control information 220 that is communicated in-line with data 215 may be buffered until the memory device 210 receives a sufficient amount of error control information 220 (e.g., associated with respective data 215) to write a block of error control information to a main memory array 230 of the memory device 210. The main memory array 230 may represent a subset or portion of a memory array of the memory device 210 used for storing the data 215 and other information received from the host device. In some examples, the memory device 210 may buffer the error control information 220 until receiving a threshold quantity of write commands for writing the data 215 to the main memory array 230, after which the memory device 210 may store or write the error control information 220 associated with the quantity of write commands (e.g., as one block of information). While buffering the error control information 220 associated with each write command, the memory device 210 may store or write the data 215 (e.g., a set of data) associated the respective write command (e.g., at the main memory array 230).

In some examples, the memory device 210 may receive seven write commands for writing the data 215, where each write command may include a set of data and corresponding in-line error control information 220. The memory device 210 may write each set of data to the main memory array 230 (e.g., to a block or portion of the array) upon receiving the corresponding write command. The memory device 210 may buffer the error control information 220 for each set of data until receiving the seventh set of data (e.g., via the seventh write command), after which the memory device 210 may perform a single write operation (e.g., an eighth write operation) to write the error control information 220 associated with the seven sets of data to a single block of memory cells (e.g., a subarray for storing 256 bits of information) in the main memory array 230. Each time one of the sets of data is read from the main memory array 230 (e.g., in response to a received read command), the memory device 210 may access the indicated data 215, as well as associated error control information 220. The error control information 220 may be accessed separately from the corresponding data 215 (e.g., using a separate read operation for accessing the data 215 and the error control information 220), for example, based on the error control information 220 being stored in a different block of memory cells than the data 215.

Accordingly, an extra write operation may be performed when storing or writing the in-line error control information 220 (e.g., an eighth write operation) and one or more extra read operations may be performed when reading the error control information 220. These extra operations may result in an increase of read or write times by 15 to 25 percent, among other examples. Similarly, reserving one eighth (e.g., or more in other examples) of the main memory array 230 for in-line error control information 220 (e.g., based on writing one block of error control information for each seven sets of data) may result in a 12.5 percent (e.g., or more) reduction in available memory storage in the main memory array 230.

While this example describes seven data write operations followed by one error control write operation, examples with different quantities of write operations may apply without departing from the scope of the present disclosure. For example, the memory device 210 may additionally or alternatively perform a consolidated error control write operation for every three data write operations. In these and other examples, the memory device 210 may incur similar increases in read or write times, as well as similar or higher reductions in available memory storage in the main memory array 230.

The memory device 210 may include a first subset 235 of the memory array, which may represent a part or portion (e.g., multiple cells) of the memory array of the memory device 210 (e.g., a same memory array that includes the main memory array 230). In some cases, the first subset 235 may represent a separate memory array of the memory device 210. In some cases, the first subset 235 may be associated with a an on-die ECC scheme or end-to-end ECC/EDC scheme on a memory channel. The first subset 235 may include memory cells operable to store the error control information 220 generated by the memory device 210 (e.g., internal error control information 220). For example, an error control component 255 may receive data 215 from the DQ pin 245 and may generate internal error control information 220 based on the received data 215. This internally generated error control information 220 may be used to detect single bit errors and may be stored as logic values in memory cells of the first subset 235 of the memory array. In some examples, the first subset 235 may be additional to the main memory array 230, such that inclusion of the first subset 235 may not decrease a size or an amount of storage available at the main memory array 230.

In order to increase available memory storage in the main memory array 230, the memory device 210 may be configured to store the error control information 220 from the host device (e.g., external error control information 220) at the first subset 235 of the memory array. The error control information 220 may be communicated from the host device to the memory device 210 in a sideband manner, for example, via a sideband channel and an additional pin 250 (e.g., a multifunction or dedicated pin, such as a CA pin). In such cases, the error control information 220 may be routed from the additional pin 250 to a multiplexer 260. The multiplexer 260 may be hard coded (e.g., by blowing a fuse) or programmable (e.g., via a mode of a mode register of the memory device 210) to store either the external error control information 220 or the internally generated error control information 220 in the first subset 235. For example, the multiplexer may be configured to store the external error control information 220 at the first subset 235. The first subset 235 may be configurable to store error control information received from the host device over a data channel (e.g., over pin 245), store error control information received from the host device over a sideband channel (e.g., over pin 250), or store error control information generated by the memory device.

In some cases, if the multiplexer 260 is configured (e.g., hard coded or programmed) to store the external error control information 220 at the first subset 235, the error control component 255 may be disabled or bypassed (e.g., via hard coding or a mode of a mode register). In some cases, if the multiplexer 260 is configured (e.g., hard coded or programmed) to store the external error control information 220 at the first subset 235, the error control component 255 may generate error control information 220 and communicate the error control information 220 to the multiplexer 260. In such cases, the multiplexer may receive the internally generated error control information 220 and the external error control information 220 and may route the external error control information 220 to the first subset 235 of the memory array (e.g., and may not route the internally generated error control information 220 to the first subset 235).

Storing the external error control information 220 at the first subset 235 may increase an amount of available storage at the main memory array 230, for example, by offloading storing of the in-line error control information 220 to the first subset 235. The external error control information 220 stored at the first subset 235 may be accessed in parallel with associated data 215 (e.g., stored at the main memory array 230), which may decrease an amount of time for read and write operations, for example, by accessing the associated data 215 and error control information 220 in parallel instead of in series.

In some cases, an amount of external error control information 220 stored at the first subset 235 may be limited by internal an error control structure of the memory device 210 (e.g., circuitry for the internally generated error control information 220, which may be used for the external error control information 220). For example, the internal error control structure may be limited to processing and storing a quantity of bits (e.g., 16 bits) of error control information 220 at the first subset 235 for every set of data (e.g., 256 bits of data 215) stored at the main memory array 230.

The memory device 210 may also include a second subset 240 of the memory array (e.g., multiple cells of the memory array), which may be operable to store the metadata information 225 (e.g., including error control information 220). In some cases, the second subset 240 may represent a different memory array than the memory array of the memory device 210. The inclusion of the second subset 240 of the memory array may, in some cases, increase a device or array size (e.g., a memory device 210 footprint). The metadata information 225 may include error control information 220, clock information (e.g., clock synchronization information), security key information (e.g., an indication of a security key), device diagnostic or health status information, or any combination thereof.

The metadata information 225 may be communicated from the host device to the memory device 210 in a side band manner, for example, via a sideband channel and the additional pin 250 (e.g., a multifunction or dedicated pin). When the metadata information 225 is received at the memory device, it may be routed from the additional pin 250 to the second subset 240 of the memory array and stored as representative logic values at memory cells of the second subset 240. Similar to the error control information 220 stored at the first subset 235, a quantity of metadata information (e.g., 16 bits) may be stored at the second subset 240 for every set of data (e.g., 256 bits) stored at the main memory array 230.

In some cases, the memory device 210 may provide for storage of metadata information 225 at the second subset 240 or may provide for storage of external error control information 220 at the first subset 235, but may not provide for both. As such, the memory device 210 may be limited to storing a quantity (e.g., 16 bits) of information (e.g., error control information 220) for every set of data (e.g., 256 bits) stored at the memory device 210. In some cases, 16 bits of error control information 220 (e.g., SECDED) for every 256 bits of data may provide a diagnostic coverage of 99.6 percent for detecting or correcting multi-bit errors (e.g., may correct or detect 99.6 of multi-bit errors). CA encoding (e.g., tagging) may be added to error control information 220 to confirm data addresses, which may represent, for example, a second quantity (e.g., four bits) of information for every set of data (e.g., 256 bits of data 215). In such cases, a quantity of error control information 220 associated with a set of data (e.g., 256 bits of data 215) may be reduced (e.g., to 12 bits) in order to include the additional bits of CA encoding in the available storage at the first subset 235 or the second subset 240.

Reducing the quantity of error control information 220 (e.g., to 12 bits for every 256 bits of data 215) may result in a lower diagnostic coverage provided by the error control information (e.g., to 93.8 percent). Additionally or alternatively, the error control information 220 may remain at the original quantity (e.g., 16 bits) to maintain a higher diagnostic coverage and the CA encoding bits may be stored in the main memory array 230 (e.g., using a similar techniques to store the in-line error control information 220 at the main memory array 230). Storing the CA encoding bits at the main memory array 230 may reduce an amount of available storage at the main memory array 230 and may increase read and write times at the main memory array 230 (e.g., similar to storing the in-line error control information 220 at the main memory array 230).

The present disclosure provides techniques for both providing storage for metadata information 225 at the second subset 240 and providing storage for external error control information 220 at the first subset 235. The metadata information 225 may be used for error control information 220 (e.g., all of the metadata information 225 may be used for error control information 220), for example, to expand storage for error control information 220. In some cases, a part of the metadata information 225 may be used for error control information 220 and another part of the metadata information 225 may be used to store other information as described herein. The described techniques may support increasing an amount of information (e.g., error control information 220) stored at the memory device 210 for each set of data stored at the memory device 210. For example, enabling storage of external error control information 220 and metadata information 225 may increase a quantity of information bits stored by the memory device 210 to a third quantity of bits for a set of data (e.g., increase from 16 bits to 32 bits for every 256 bits of data 215). The increased amount of storage for error control information 220 at the memory device 210 may increase a diagnostic coverage provided by the memory device 210 and may additionally or alternatively provide for storing other information at the memory device 210 (e.g., metadata information such as clock information, security key information, device diagnostic information, health status information).

In a first example, for every set or block of data (e.g., 256 bits of data 215) written to the main memory array 230, the memory device 210 may receive and store a quantity of bits (e.g., 16 bits) of error control information 220 at the first subset 235. The memory device 210 may concurrently receive and store a quantity of bits (e.g., 16 bits) of metadata information 225 at the second subset 240, which may include bits for CA encoding (e.g., four or more bits) and additional metadata information as described herein. In some cases, 16 bits of error control information 220 may provide, for example, a 99.6 percent diagnostic coverage.

In a second example, for every set or block of data (e.g., 256 bits of data 215) written to the main memory array 230, the memory device 210 may receive and store a quantity of bits (e.g., 16 bits) of error control information 220 at the first subset 235. The memory device 210 may concurrently receive and store a first quantity of bits (e.g., half of the bits, or eight bits) of metadata information 225 at the second subset 240, where the first quantity of bits may include error control information 220. The metadata information 225 may also include a second quantity of bits (e.g., eight bits) that may include bits for CA encoding (e.g., four or more bits) and additional metadata information as described herein. In some cases, an increased quantity (e.g., 24 bits) of error control information 220 stored in this example may provide, for example, a 99.998 percent diagnostic coverage.

In some cases, a portion of the metadata information 225 (e.g., eight bits out of 16 bits) may be reserved for flagging status or other information to the host device. In some cases, the host device may communicate the metadata information 225 without communicating error control information 220 (e.g., may communicate 32 bits of metadata information 225), or may communicate anywhere from half of the available information to all of the available information (e.g., eight bits to 16 bits) as metadata information 225.

The metadata information 225 and the error control information 220 may be received at the memory device 210 via a same sideband channel, such as via the additional pin 250, and in a serial fashion. For example, a set of bits 205-*b* received via the additional pin 250 may include a subset of error control bits 270 and a subset of metadata bits 275. The memory device may include circuitry 265 for processing the set of bits 205-*b*. The circuitry 265 may represent logic circuitry that may receive the set of bits 205-*b* via the additional pin 250 and may identify metadata information 225 and error control information 220 within the set of bits 205-*b*. The circuitry 265 may, for example, identify the metadata information 225 and error control information 220 based on a flag associated with one of the bits of the set of bits 205-*b*. For example, an index of a bit within the set of bits 205-*b* may be associated (e.g., via a configuration) with a last metadata bit or a last error control bit of the set of bits 205-*b*. In some examples, a bit of metadata information may be flagged within the set of bits 205-*b*, which may indicate a first metadata bit or a last metadata bit within the set of bits 205-*b*.

The circuitry 265 may also convert the set of bits 205-*b* from serial bits to parallel bits. For example, the circuitry 265 may put the metadata information 225 and the error control information into different parallel buses. The circuitry 265 may, for example, route the metadata information 225 to the second subset 240 of the memory array (e.g., via a respective bus). In parallel, the circuitry 265 may route the error control information 220 to the multiplexer 260, where the multiplexer 260 may route the error control information 220 to the first subset 235 of the memory array (e.g., based on a configuration of the multiplexer 260 as described herein). For example, the multiplexer 260 may operate as describe herein and may, in some cases, receive external error control information 220 (e.g., from the circuitry 265), or may receive external error control information 220 and internal error control information 220 (e.g., from the error control component 255) and may route one of the external error control information 220 and internal error control information 220 to the first subset 235. The circuitry 265 may, in some cases, include an addressing component to route the metadata information 225 and the error control information 220 to a correct location (e.g., the metadata information 225 to the second subset 240 and the error control information 220 to the multiplexer 260).

When accessing the error control information 220 and the metadata information 225 (e.g., in response to a read command from the host device), the memory device 210 may access the error control information 220 and/or the metadata information 225 from a corresponding storage location in the first subset 235 or the second subset 240, respectively. The circuitry 265 may receive the error control information 220 and/or the metadata information 225 from the respective first subset 235 and/or second subset 240 and may combine the error control information 220 and/or the metadata information 225 for transmission to the host device (e.g., via the additional pin 250). For example, the circuitry 265 may combine the subset of error control bits 270 and the subset of metadata bits 275 (e.g., via a parallel to serial conversion) in a same order as received via the additional pin 250 (e.g., in a same order as received in the set of bits 205-*b*). The memory device 210 may transmit the error control information 220 and/or the metadata information 225 to the host device in a same order as received from the host device, for example, based on combining the subset of error control bits 270 and the subset of metadata bits 275.

Figure 3:
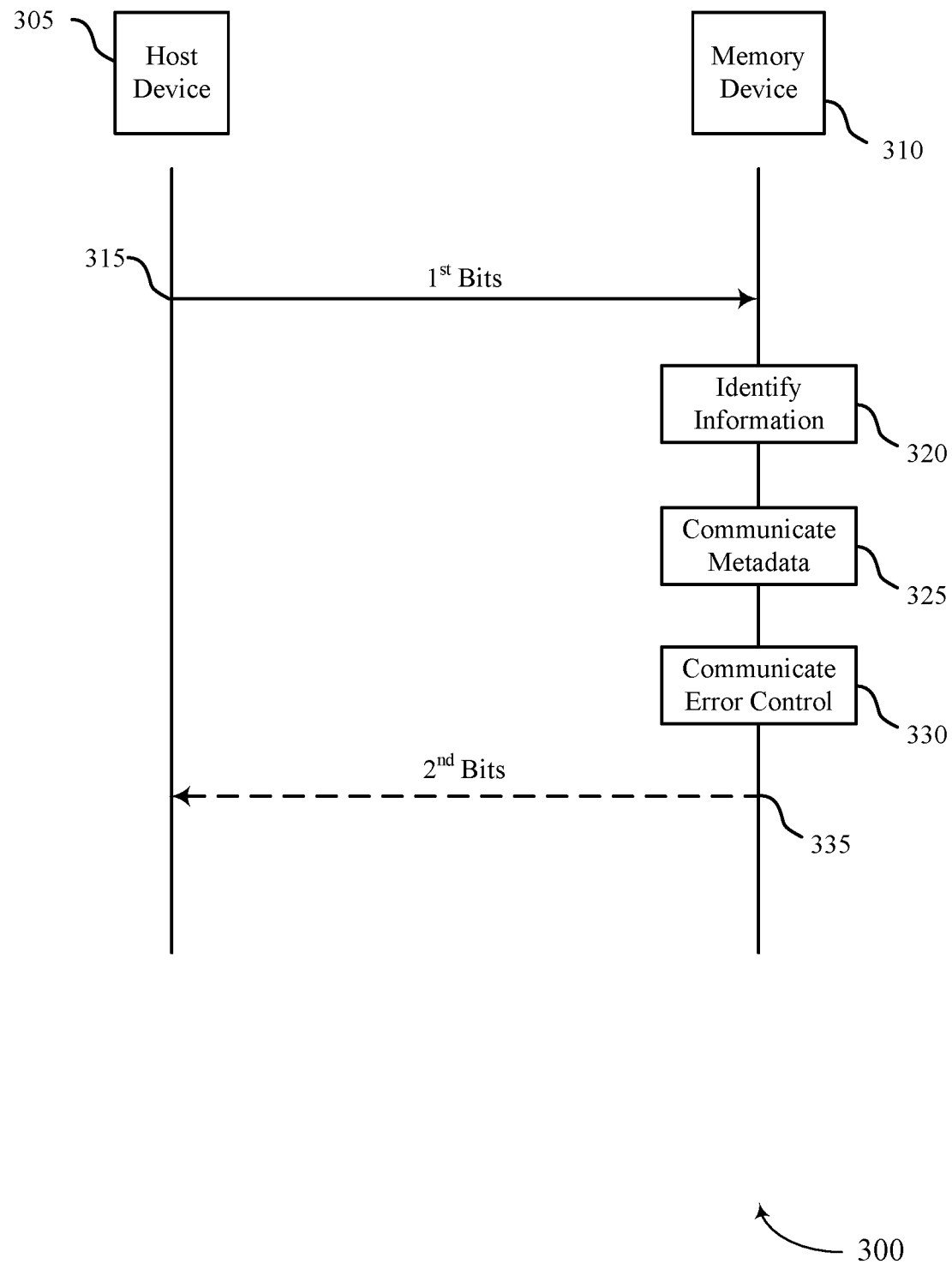
FIG. 3 illustrates an example of a process flow that supports metadata storage at a memory device in accordance with examples as disclosed herein.

FIG. 3 illustrates an example of a process flow 300 that supports metadata storage at a memory device in accordance with examples as disclosed herein. Process flow 300 may implement or be implemented by aspects of system 100 or device architecture 200. For example, process flow 300 may be implemented by a host device 305 and a memory device 310. Host device 305 and memory device 310 may implement the process flow 300 to store metadata information and error control information at the memory device 310, for example, as described with reference to FIG. 2 herein.

In the following description of process flow 300, the operations between the host device 305 and the memory device 310 may be transmitted in a different order than the order shown, or the operations performed by the host device 305 and the memory device 310 may be performed in different orders or at different times. For example, specific operations may also be left out of process flow 300, or other operations may be added to process flow 300. Although the host device 305 and the memory device 310 are shown performing the operations of the process flow 300, some aspects of some operations may also be performed by one or more other wireless devices.

At 315, the host device 305 may communicate a set of bits to the memory device 310. For example, the host device 305 may communicate the set of bits to the memory device 310 via a side channel (e.g., an error control channel or a dedicated channel) and an associated pin of the memory device (e.g., a dedicated pin). The set of bits may include first error control information and metadata information, among other examples described herein. The memory device 310 may receive the set of bits at the pin. The set of bits may be associated with a write command, communicated from the host device 305 to the memory device 310, that may indicate for the memory device 310 to store the set of bits.

In some cases, the host device 305 may additionally communicate a set of data bits to the memory device 310 (e.g., in parallel with the set of bits), for example, via a DQ channel and associated DQ pin, where the set of bits may be associated with the set of data bits. In some cases, the host device 305 may indicate that the set of bits and the set of data bits are associated (e.g., using the set of bits or the set of data bits). The set of data bits may also be associated with a write command (e.g., a same write command as the set of bits, or a different write command), communicated from the host device 305 to the memory device 310, that may indicate for the memory device 310 to store the set of data bits.

At 320, the memory device 310 may identify, at a first circuit of the memory device 310, the metadata information and the first error control information based on receiving the set of bits. The first circuit may include logic circuitry configured to identify the metadata information and the first error control information in the set of bits. For example, the first circuit of the memory device 310 may receive the set of bits via the pin and may identify the metadata information and the first error control information based on a flag associated with one of the bits (e.g., indicating a first or last position of the metadata information and/or the error control information).

At 325, the memory device 310 (e.g., the first circuit of the memory device 310) may communicate the metadata information from the first circuit to a first set of memory cells of a memory array of the memory device based on identifying the metadata information. The first set of memory cells may be operable to store the metadata information, for example, based on being dedicated to storing metadata information as described herein. The first circuit of the memory device 310 may include a serial to parallel converter that may be operable to receive the set of bits in a serial fashion and communicate the metadata information and the first error control information from the first circuit in a parallel fashion.

At 330, the memory device 310 (e.g., the first circuit of the memory device 310) may communicate the first error control information from the first circuit to an error control circuit based on identifying the first error control information. The error control circuit may include a multiplexer and/or an error control component as described herein. The multiplexer may be operable to receive the first error control information, or second error control information (e.g., generated by and communicated from the error control component) and the first error control information, and store the first error control information or the second error control information at a second set of memory cells of the memory array of the memory device.

For example, the multiplexer may be programmed or hard coded to store either the second error control information or the first error control information at the second set of memory cells. In some cases, the multiplexer may receive the first error control information and not the second error control information and may store the first error control information at the second set of memory cells. The second set of memory cells may be operable to store error control information (e.g., the first error control information or the second error control information), for example, based on being dedicated to storing error control information as described herein.

At 335, in some cases, the memory device 310 may communicate a second set of bits to the host device 305 (e.g., in response to a read command received from the host device 305). The second set of bits may include all or part of the set of bits and may include, for example, at least a part of the metadata information or the first error control information included in the set of bits. In some cases, the host device 305 may communicate a read command to the memory device 310 (e.g., prior to 335), where the read command may indicate for the memory device 310 to read and communicate the second set of bits to the host device 305.

The first circuit of the memory device 310 may, in some cases, access at least a portion of the metadata information and at least a portion of the first error control information from the respective set of memory cells and may convert the accessed metadata information and first error control information to the second set of bits. For example, the first circuit may receive the accessed metadata information and first error control information in a parallel fashion (e.g., from the respective set of memory cells) and may perform a parallel to serial conversion (e.g., using a parallel to serial converter) to serially communicate the accessed metadata information and first error control information via the second set of bits. The first circuit may, in some cases, identify an order in which the metadata information and the first error control information was received from the host device 305 and may perform the parallel to serial conversion based on the identified order (e.g., may communicate the accessed metadata information and first error control information via the second set of bits in a same order as received from the host device 305 via the set of bits).

Figure 4:
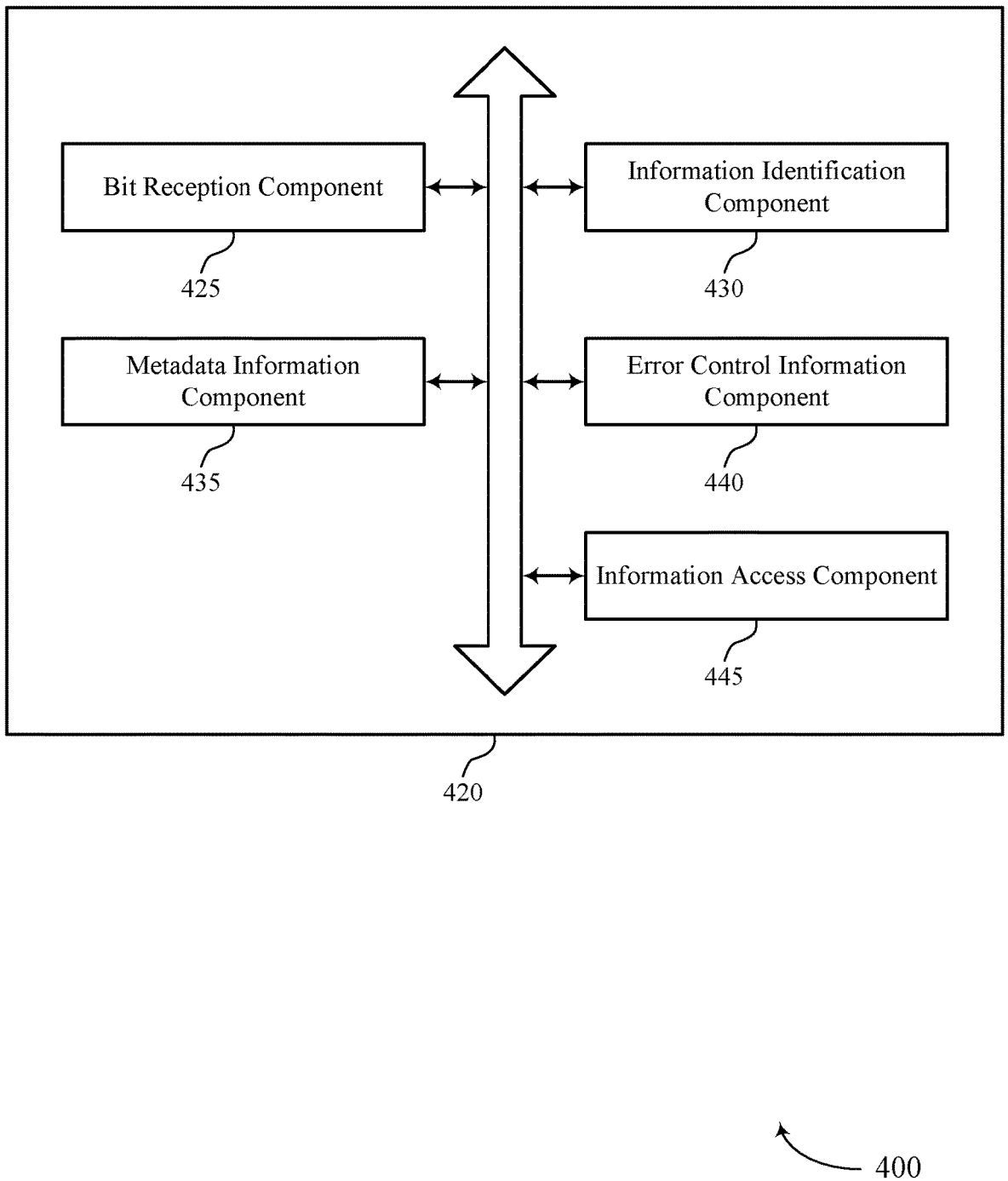
FIG. 4 shows a block diagram of a memory device that supports metadata storage at a memory device in accordance with examples as disclosed herein.

FIG. 4 shows a block diagram 400 of a memory device 420 that supports metadata storage at a memory device in accordance with examples as disclosed herein. The memory device 420 may be an example of aspects of a memory device as described with reference to FIGS. 1 through 3. The memory device 420, or various components thereof, may be an example of means for performing various aspects of metadata storage at a memory device as described herein. For example, the memory device 420 may include a bit reception component 425, an information identification component 430, a metadata information component 435, an error control information component 440, an information access component 445, or any combination thereof. Each of these components may communicate, directly or indirectly, with one another (e.g., via one or more buses).

The bit reception component 425 may be configured as or otherwise support a means for receiving, at a pin of a memory device, a set of bits that includes first error control information and metadata information. The information identification component 430 may be configured as or otherwise support a means for identifying, at a first circuit of the memory device, the metadata information and the first error control information based at least in part on receiving the set of bits. In some examples, the metadata information is identified using a flag that indicates a position of a least one bit of metadata information within the set of bits.

The metadata information component 435 may be configured as or otherwise support a means for communicating the metadata information from the first circuit to a first set of memory cells of a memory array of the memory device based at least in part on identifying the metadata information, the first set of memory cells operable to store the metadata information. The error control information component 440 may be configured as or otherwise support a means for communicating the first error control information from the first circuit to an error control circuit based at least in part on identifying the first error control information.

In some examples, the metadata information includes error control information, clock information, a security key, diagnostic information, health status information, or any combination thereof. In some examples, the first error control information includes error correction code information, error detection code information, single error correction double error detection information, or any combination thereof. In some examples, the memory array includes a second set of memory cells operable to store error control information and a third set of memory cells operable to store information associated with a host device.

In some examples, the bit reception component 425 may be configured as or otherwise support a means for receiving a write command associated with the set of bits, where communicating the metadata information and the first error control information is based at least in part on the write command.

In some examples, the error control information component 440 may be configured as or otherwise support a means for generating second error control information at an error control component of the error control circuit based at least in part on data received by the memory device. In some examples, the error control information component 440 may be configured as or otherwise support a means for receiving, at a multiplexer of the error control circuit, the first error control information from the first circuit. In some examples, the error control information component 440 may be configured as or otherwise support a means for receiving, at the multiplexer, the second error control information from the error control component.

In some examples, the error control information component 440 may be configured as or otherwise support a means for determining, at the multiplexer, between communicating the first error control information to the second set of memory cells and communicating the second error control information to the second set of memory cells based at least in part on receiving the first error control information and receiving the second error control information.

In some examples, the information access component 445 may be configured as or otherwise support a means for accessing the metadata information from the first set of memory cells based at least in part on communicating the metadata information to the first set of memory cells. In some examples, the information access component 445 may be configured as or otherwise support a means for communicating the metadata information to the pin based at least in part on accessing the metadata information.

In some examples, the information access component 445 may be configured as or otherwise support a means for identifying a sequence associated with receiving the set of bits, where communicating the metadata information to the pin is based at least in part on the sequence. In some examples, the information access component 445 may be configured as or otherwise support a means for receiving a read command, where accessing the metadata information is based at least in part on the read command.

In some examples, the information access component 445 may be configured as or otherwise support a means for accessing error control information from the second set of memory cells based at least in part on communicating the first error control information to the error control circuit. In some examples, the information access component 445 may be configured as or otherwise support a means for communicating the error control information to the pin based at least in part on accessing the error control information, where communicating the error control information to the pin is performed at least partially concurrently with communicating the metadata information to the pin.

Figure 5:
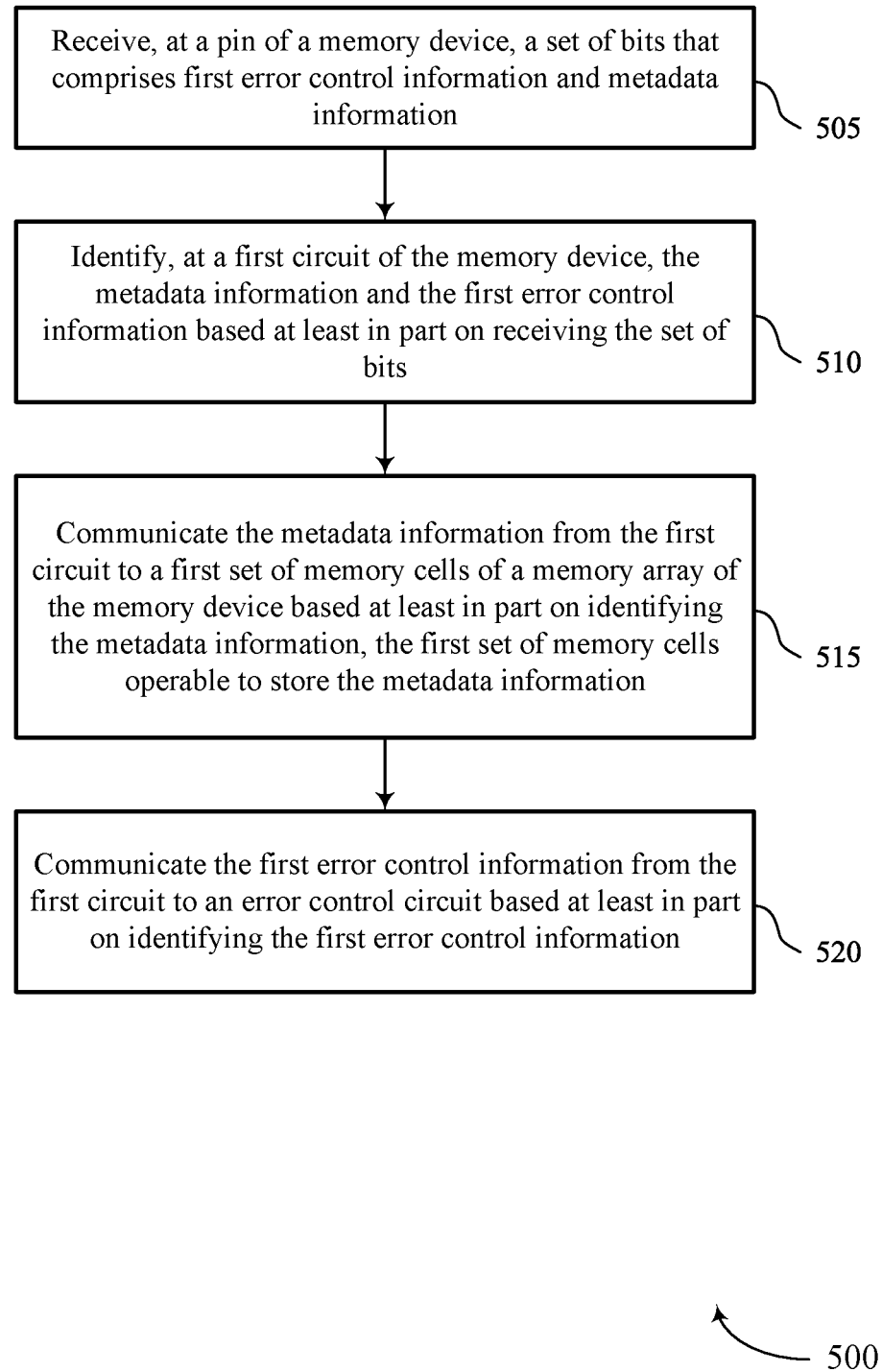
FIG. 5 shows a flowchart illustrating a method or methods that support metadata storage at a memory device in accordance with examples as disclosed herein.

FIG. 5 shows a flowchart illustrating a method 500 that supports metadata storage at a memory device in accordance with examples as disclosed herein. The operations of method 500 may be implemented by a memory device or its components as described herein. For example, the operations of method 500 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 505, the method may include receiving, at a pin of a memory device, a set of bits that includes first error control information and metadata information. The operations of 505 may be performed in accordance with examples as disclosed with reference to FIGS. 2 and 3. In some examples, aspects of the operations of 505 may be performed by a bit reception component 425 as described with reference to FIG. 4.

At 510, the method may include identifying, at a first circuit of the memory device, the metadata information and the first error control information based at least in part on receiving the set of bits. The operations of 510 may be performed in accordance with examples as disclosed with reference to FIGS. 2 and 3. In some examples, aspects of the operations of 510 may be performed by an information identification component 430 as described with reference to FIG. 4.

At 515, the method may include communicating the metadata information from the first circuit to a first set of memory cells of a memory array of the memory device based at least in part on identifying the metadata information, the first set of memory cells operable to store the metadata information. The operations of 515 may be performed in accordance with examples as disclosed with reference to FIGS. 2 and 3. In some examples, aspects of the operations of 515 may be performed by a metadata information component 435 as described with reference to FIG. 4.

At 520, the method may include communicating the first error control information from the first circuit to an error control circuit based at least in part on identifying the first error control information. The operations of 520 may be performed in accordance with examples as disclosed with reference to FIGS. 2 and 3. In some examples, aspects of the operations of 520 may be performed by an error control information component 440 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for receiving, at a pin of a memory device, a set of bits that includes first error control information and metadata information, identifying, at a first circuit of the memory device, the metadata information and the first error control information based on receiving the set of bits, communicating the metadata information from the first circuit to a first set of memory cells of a memory array of the memory device based on identifying the metadata information, the first set of memory cells operable to store the metadata information, and communicating the first error control information from the first circuit to an error control circuit based on identifying the first error control information.

In some examples of the method 500 and the apparatus described herein, the metadata information may be identified using a flag that indicates a position of a least one bit of metadata information within the set of bits.

Some examples of the method 500 and the apparatus described herein may further include operations, features, circuitry, logic, means, or instructions for receiving a write command associated with the set of bits, where communicating the metadata information and the first error control information may be based on the write command.

Some examples of the method 500 and the apparatus described herein may further include operations, features, circuitry, logic, means, or instructions for generating second error control information at an error control component of the error control circuit based on data received by the memory device, receiving, at a multiplexer of the error control circuit, the first error control information from the first circuit, receiving, at the multiplexer, the second error control information from the error control component, and determining, at the multiplexer, between communicating the first error control information to the second set of memory cells and communicating the second error control information to the second set of memory cells based on receiving the first error control information and receiving the second error control information.

Some examples of the method 500 and the apparatus described herein may further include operations, features, circuitry, logic, means, or instructions for accessing the metadata information from the first set of memory cells based on communicating the metadata information to the first set of memory cells and communicating the metadata information to the pin based on accessing the metadata information.

Some examples of the method 500 and the apparatus described herein may further include operations, features, circuitry, logic, means, or instructions for identifying a sequence associated with receiving the set of bits, where communicating the metadata information to the pin may be based on the sequence.

Some examples of the method 500 and the apparatus described herein may further include operations, features, circuitry, logic, means, or instructions for receiving a read command, where accessing the metadata information may be based on the read command.

Some examples of the method 500 and the apparatus described herein may further include operations, features, circuitry, logic, means, or instructions for accessing error control information from the second set of memory cells based on communicating the first error control information to the error control circuit and communicating the error control information to the pin based on accessing the error control information, where communicating the error control information to the pin may be performed at least partially concurrently with communicating the metadata information to the pin.

In some examples of the method 500 and the apparatus described herein, the metadata information includes error control information, clock information, a security key, diagnostic information, health status information, or any combination thereof.

In some examples of the method 500 and the apparatus described herein, the first error control information includes error correction code information, error detection code information, single error correction double error detection information, or any combination thereof.

In some examples of the method 500 and the apparatus described herein, the memory array includes a second set of memory cells operable to store error control information and a third set of memory cells operable to store information associated with a host device.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a pin, a memory array including a first set of memory cells operable to store metadata information, a second set of memory cells operable to store error control information, and a third set of memory cells operable to store information associated with a host device, and a controller coupled with the pin and the memory array, the controller operable to receive, via the pin, a set of bits that includes first error control information and the metadata information, communicate the metadata information to the first set of memory cells based on identifying the metadata information and the first error control information based on receiving the set of bits, and communicate the first error control information to an error control circuit based on identifying the first error control information In some examples of the apparatus, the controller may be further operable to identify the metadata information using a flag that indicates a position of a least one bit of metadata information within the set of bits, where communicating the metadata information to the first set of memory cells may be based on identifying the metadata information. In some examples of the apparatus, the controller may be further operable to receive a write command associated with the set of bits, where communicating the metadata information and the first error control information may be based on the write command.

In some examples of the apparatus, the error control circuit includes an error control component operable to generate second error control information based on data received by the apparatus and a multiplexer operable to receive the first error control information from the controller, receive the second error control information from the error control component, and determine between communicating the first error control information to the second set of memory cells and communicating the second error control information to the second set of memory cells based on receiving the first error control information and receiving the second error control information. In some examples of the apparatus, the controller may be further operable to access the metadata information from the first set of memory cells based on communicating the metadata information to the first set of memory cells and communicate the metadata information to the pin based on accessing the metadata information.

In some examples of the apparatus, the controller may be further operable to identify a sequence associated with receiving the set of bits, where communicating the metadata information to the pin may be based on the sequence. In some examples of the apparatus, the controller may be further operable to access error control information from the second set of memory cells based on communicating the first error control information to the error control circuit and communicate the error control information to the pin based on accessing the error control information, where communicating the error control information to the pin may be performed at least partially concurrently with communicating the metadata information to the pin.

Another apparatus is described. The apparatus may include an array of memory cells including a first subset of the array of memory cells operable to store metadata information, a second subset of the array of memory cells operable to store error control information, and a third subset of the array of memory cells operable to store information associated with a host device, a set of pins couplable to the host device for communication between the array of memory cells and the host device, and circuitry coupled with the array of memory cells and at least one pin of the set, the circuitry configured to receive, via the at least one pin, a stream of bits that includes a first set of bits representative of first error control information and a second set of bits representative of metadata information, write logic values based on the metadata information to the first subset of the array of memory cells, and transmit the first set of bits representative of the first error control information to circuitry configured for error control In some examples of the apparatus, the circuitry includes a first component operable to identify a destination for each bit of the stream of bits. In some examples of the apparatus, the circuitry may be further operable to identify the metadata information within the stream of bits, where communicating the metadata information to the first subset of the array of memory cells may be based on identifying the metadata information. In some examples of the apparatus, the circuitry may be further operable to identify the metadata information using a flag that indicates a position of at least one bit of metadata information within the stream of bits, where writing the logic values to the first subset of the array of memory cells may be based on identifying the metadata information.

In some examples of the apparatus, the circuitry configured for error control includes an error control component operable to generate second error control information based on data received by the apparatus and a multiplexer coupled with the circuitry and the error control component, the multiplexer operable to receive the first error control information from the circuitry, receive the second error control information from the error control component, and determine whether to communicate the first error control information to the second subset of the array of memory cells or communicate the second error control information to the second subset of the array of memory cells based on receiving the first error control information and receiving the second error control information.

In some examples of the apparatus, the circuitry may be further operable to receive the metadata information from the array of memory cells and communicate the metadata information to the at least one pin based on receiving the metadata information from the array of memory cells. In some examples of the apparatus, the metadata information includes error control information, clock information, a security key, diagnostic information, health status information, or any combination thereof. In some examples of the apparatus, the first error control information includes error correction code information, error detection code information, single error correction double error detection information, or any combination thereof.

Another apparatus is described. The apparatus may include an array of memory cells including a first subset of the array of memory cells operable to store metadata information, a second subset of the array of memory cells operable to store error control information, and a third subset of the array of memory cells operable to store information associated with a host device, a set of pins couplable to the host device for communication between the array of memory cells and the host device, and circuitry coupled with the array of memory cells and at least one pin of the set, the circuitry operable to receive, via the at least one pin, a stream of bits that includes a first set of bits representative of metadata information and write logic values based on the metadata information to the first subset of the array of memory cells In some examples of the apparatus, the circuitry includes a first component operable to identify a destination for each bit of the stream of bits. In some examples of the apparatus, the circuitry may be further operable to identify the metadata information within the stream of bits, where writing the logic values to the first subset of the array of memory cells may be based on identifying the metadata information. In some examples of the apparatus, the metadata information may be identified using a flag that indicates a position of a least one bit of metadata information within the stream of bits.

In some examples of the apparatus, the circuitry may be further operable to identify first error control information within the stream of bits and communicate the first error control information to circuitry configured for error control based on identifying the first error control information. In some examples of the apparatus, the circuitry configured for error control includes an error control component operable to generate second error control information based on data received by the apparatus and a multiplexer coupled with the circuitry and the error control component, the multiplexer operable to receive the first error control information from the circuitry, receive the second error control information from the error control component, and determine between communicating the first error control information to the second subset of the array of memory cells and communicating the second error control information to the second subset of the array of memory cells based on receiving the first error control information and receiving the second error control information.

In some examples of the apparatus, the circuitry may be further operable to receive the metadata information from the array of memory cells and communicate the metadata information to the at least one pin based on receiving the metadata information from the array of memory cells. In some examples of the apparatus, each bit of the stream of bits includes a bit of the metadata information.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a pin of a memory device, a plurality of bits that comprises first error control information and metadata information;
   identifying, at a first circuit of the memory device, the metadata information and the first error control information based at least in part on receiving the plurality of bits, wherein the metadata information is identified using a flag that indicates a position of at least one bit of metadata information within the plurality of bits and is included within the plurality of bits indicating the metadata information;
   communicating the metadata information from the first circuit to a first plurality of memory cells of a memory array of the memory device based at least in part on identifying the metadata information, the first plurality of memory cells operable to store the metadata information; and
   communicating the first error control information from the first circuit to an error control circuit based at least in part on identifying the first error control information.

2. The method of claim 1, further comprising:
   receiving a write command associated with the plurality of bits, wherein communicating the metadata information and the first error control information is based at least in part on the write command.

3. The method of claim 1, further comprising:
   generating second error control information at an error control component of the error control circuit based at least in part on data received by the memory device;
   receiving, at a multiplexer of the error control circuit, the first error control information from the first circuit;
   receiving, at the multiplexer, the second error control information from the error control component; and
   determining, at the multiplexer, between communicating the first error control information to a second plurality of memory cells operable to store error control information and communicating the second error control information to the second plurality of memory cells based at least in part on receiving the first error control information and receiving the second error control information.

4. The method of claim 1, further comprising:
   accessing the metadata information from the first plurality of memory cells based at least in part on communicating the metadata information to the first plurality of memory cells; and
   communicating the metadata information to the pin based at least in part on accessing the metadata information.

5. The method of claim 4, further comprising:
   identifying a sequence associated with receiving the plurality of bits, wherein communicating the metadata information to the pin is based at least in part on the sequence.

6. The method of claim 4, further comprising:
   receiving a read command, wherein accessing the metadata information is based at least in part on the read command.

7. The method of claim 4, further comprising:
   accessing error control information from a second plurality of memory cells operable to store error control information based at least in part on communicating the first error control information to the error control circuit; and communicating the error control information to the pin based at least in part on accessing the error control information, wherein communicating the error control information to the pin is performed at least partially concurrently with communicating the metadata information to the pin.

8. The method of claim 1, wherein the metadata information comprises error control information, clock information, a security key, diagnostic information, health status information, or any combination thereof.

9. The method of claim 1, wherein the first error control information comprises error correction code information, error detection code information, single error correction double error detection information, or any combination thereof.

10. The method of claim 1, wherein the memory array comprises a second plurality of memory cells operable to store error control information and a third plurality of memory cells operable to store information associated with a host device.

11. The method of claim 1, further comprising:
receiving, at the pin of the memory device, a second plurality of bits that comprises second error control information and second metadata information;
identifying, at the first circuit of the memory device, the second metadata information and the second error control information based at least in part on receiving the second plurality of bits, wherein the second metadata information is identified using a second flag that indicates a position of at least one bit of second metadata information within the second plurality of bits; and
communicating the second metadata information from the first circuit to a second plurality of memory cells of the memory array of the memory device based at least in part on identifying the second metadata information.

12. A memory system, comprising:
a pin;
a memory array comprising:
a first plurality of memory cells operable to store metadata information;
a second plurality of memory cells operable to store error control information; and
a third plurality of memory cells operable to store information associated with a host device; and
processing circuitry coupled with the pin and the memory array, the processing circuitry operable to:
receive, via the pin, a plurality of bits that comprises first error control information and the metadata information;
identify the metadata information using a flag that indicates a position of at least one bit of metadata information within the plurality of bits and is included within the plurality of bits indicating the metadata information;
communicate the metadata information to the first plurality of memory cells based at least in part on identifying the metadata information and the first error control information based at least in part on receiving the plurality of bits; and
communicate the first error control information to an error control circuit based at least in part on identifying the first error control information.

13. The memory system of claim 12, wherein the processing circuitry is further operable to:
receive a write command associated with the plurality of bits, wherein communicating the metadata information and the first error control information is based at least in part on the write command.

14. The memory system of claim 12, wherein the error control circuit comprises:
an error control component operable to generate second error control information based at least in part on data received by the memory system; and
a multiplexer operable to:
receive the first error control information from the processing circuitry;
receive the second error control information from the error control component; and
determine between communicating the first error control information to the second plurality of memory cells and communicating the second error control information to the second plurality of memory cells based at least in part on receiving the first error control information and receiving the second error control information.

15. The memory system of claim 12, wherein the processing circuitry is further operable to:
access the metadata information from the first plurality of memory cells based at least in part on communicating the metadata information to the first plurality of memory cells; and
communicate the metadata information to the pin based at least in part on accessing the metadata information.

16. The memory system of claim 15, wherein the processing circuitry is further operable to:
identify a sequence associated with receiving the plurality of bits, wherein communicating the metadata information to the pin is based at least in part on the sequence.

17. The memory system of claim 15, wherein the processing circuitry is further operable to:
access error control information from the second plurality of memory cells based at least in part on communicating the first error control information to the error control circuit; and
communicate the error control information to the pin based at least in part on accessing the error control information, wherein communicating the error control information to the pin is performed at least partially concurrently with communicating the metadata information to the pin.

18. The memory system of claim 12, wherein the processing circuitry is further operable to:
receive, at the pin, a second plurality of bits that comprises second error control information and second metadata information;
identify the second metadata information and the second error control information based at least in part on receiving the second plurality of bits, wherein the second metadata information is identified using a second flag that indicates a position of at least one bit of second metadata information within the second plurality of bits; and
communicate the second metadata information to the first plurality of memory cells based at least in part on identifying the second metadata information.

19. A non-transitory computer-readable medium storing code comprising instructions executable by processing circuitry to:
receive, at a pin of a memory device, a plurality of bits that comprises first error control information and metadata information;
identify, at a first circuit of the memory device, the metadata information and the first error control information based at least in part on receiving the plurality of bits, wherein the metadata information is identified using a flag that indicates a position of at least one bit of metadata information within the plurality of bits and is included within the plurality of bits indicating the metadata information;
communicate the metadata information from the first circuit to a first plurality of memory cells of a memory array of the memory device based at least in part on identifying the metadata information, the first plurality of memory cells operable to store the metadata information; and
communicate the first error control information from the first circuit to an error control circuit based at least in part on identifying the first error control information.

20. The non-transitory computer-readable medium of claim 19, wherein the instructions are further executable by the processing circuitry to:
receive, at the pin of the memory device, a second plurality of bits that comprises second error control information and second metadata information;
identify, at the first circuit of the memory device, the second metadata information and the second error control information based at least in part on receiving the second plurality of bits, wherein the second metadata information is identified using a second flag that indicates a position of at least one bit of second metadata information within the second plurality of bits; and
communicate the second metadata information from the first circuit to the first plurality of memory cells of the memory array of the memory device based at least in part on identifying the second metadata information.

21. A memory system, comprising:
an array of memory cells comprising:
a first subset of the array of memory cells operable to store metadata information;
a second subset of the array of memory cells operable to store error control information; and
a third subset of the array of memory cells operable to store information associated with a host device;
a plurality of pins couplable to the host device for communication between the array of memory cells and the host device; and
circuitry coupled with the array of memory cells and at least one pin of the plurality of pins, the circuitry configured to:
receive, via the at least one pin, a stream of bits that comprises a first set of bits representative of first error control information and a second set of bits representative of metadata information;
identify the metadata information using a flag that indicates a position of at least one bit of metadata information within the stream of bits and is included within the stream of bits indicating the metadata information;
write logic values based at least in part on identifying the metadata information to the first subset of the array of memory cells; and
transmit the first set of bits representative of the first error control information to a component configured for error control.

22. The memory system of claim 21, wherein the circuitry comprises:
a first component operable to identify a destination for each bit of the stream of bits.

23. The memory system of claim 21, wherein:
the circuitry is further operable to identify the metadata information within the stream of bits, and
communicating the metadata information to the first subset of the array of memory cells is based at least in part on identifying the metadata information.

24. The memory system of claim 21, wherein the circuitry configured for error control comprises:
an error control component operable to generate second error control information based at least in part on data received by the memory system; and
a multiplexer coupled with the circuitry and the error control component, the multiplexer operable to:
receive the first error control information from the circuitry;
receive the second error control information from the error control component; and
determine whether to communicate the first error control information to the second subset of the array of memory cells or communicate the second error control information to the second subset of the array of memory cells based at least in part on receiving the first error control information and receiving the second error control information.

25. The memory system of claim 21, wherein the circuitry is further operable to:
receive the metadata information from the array of memory cells; and
communicate the metadata information to the at least one pin based at least in part on receiving the metadata information from the array of memory cells.

26. The memory system of claim 20, wherein the metadata information comprises the error control information, clock information, a security key, diagnostic information, health status information, or any combination thereof.

27. The memory system of claim 20, wherein the first error control information comprises error correction code information, error detection code information, single error correction double error detection information, or any combination thereof.

28. The memory system of claim 21, wherein the circuitry is further configured to:
receive, via the at least one pin, a second stream of bits that comprises a first set of bits representative of second error control information and a second set of bits representative of second metadata information;
identify the second metadata information using a second flag that indicates a position of at least one bit of second metadata information within the second stream of bits; and
write second logic values based at least in part on identifying the second metadata information to the first subset of the array of memory cells.

29. A memory system, comprising:
an array of memory cells comprising:
a first subset of the array of memory cells operable to store metadata information;
a second subset of the array of memory cells operable to store error control information; and
a third subset of the array of memory cells operable to store information associated with a host device;
a plurality of pins couplable to the host device for communication between the array of memory cells and the host device; and
circuitry coupled with the array of memory cells and at least one pin of the plurality of pins, the circuitry operable to:

receive, via the at least one pin, a stream of bits that comprises a first set of bits representative of metadata information;

identify the metadata information using a flag that indicates a position of at least one bit of metadata information within the stream of bits and is included within the stream of bits indicating the metadata information; and write logic values based at least in part on identifying the metadata information to the first subset of the array of memory cells.

30. The memory system of claim 29, wherein the circuitry comprises:

a first component operable to identify a destination for each bit of the stream of bits.

31. The memory system of claim 29, wherein the circuitry is further operable to:

identify first error control information within the stream of bits; and communicate the first error control information to a component configured for error control based at least in part on identifying the first error control information.

32. The memory system of claim 31, wherein the circuitry configured for error control comprises:

an error control component operable to generate second error control information based at least in part on data received by the memory system; and a multiplexer coupled with the circuitry and the error control component, the multiplexer operable to:

receive the first error control information from the circuitry;

receive the second error control information from the error control component; and determine between communicating the first error control information to the second subset of the array of memory cells and communicating the second error control information to the second subset of the array of memory cells based at least in part on receiving the first error control information and receiving the second error control information.

33. The memory system of claim 29, wherein the circuitry is further operable to:

receive the metadata information from the array of memory cells; and communicate the metadata information to the at least one pin based at least in part on receiving the metadata information from the array of memory cells.

34. The memory system of claim 29, wherein each bit of the stream of bits comprises a bit of the metadata information.

35. The memory system of claim 29, wherein the circuitry is further operable to:

receive, via the at least one pin, a second stream of bits that comprises a second set of bits representative of second metadata information;

identify the second metadata information using a second flag that indicates a position of at least one bit of second metadata information within the second stream of bits; and write second logic values based at least in part on identifying the second metadata information to the first subset of the array of memory cells.

\* \* \* \* \*